(12) United States Patent
Iwakaji et al.

(10) Patent No.: US 11,575,031 B2
(45) Date of Patent: Feb. 7, 2023

(54) SEMICONDUCTOR ELEMENT AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yoko Iwakaji, Meguro Tokyo (JP); Tomoko Matsudai, Shibuya Tokyo (JP); Hiroko Itokazu, Kawasaki Kanagawa (JP); Keiko Kawamura, Yokohama Kanagawa (JP); Kaori Fuse, Yokohama Kanagawa (JP); Takako Motai, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 31 days.

(21) Appl. No.: 17/201,108

(22) Filed: Mar. 15, 2021

(65) Prior Publication Data

US 2022/0077306 A1    Mar. 10, 2022

(30) Foreign Application Priority Data

Sep. 10, 2020   (JP) .............................. JP2020-152286

(51) Int. Cl.
*H01L 29/739*    (2006.01)
(52) U.S. Cl.
CPC ................................. *H01L 29/7397* (2013.01)
(58) Field of Classification Search
CPC .................................................. H01L 29/7397

USPC .......................................................... 257/139
See application file for complete search history.

(56) References Cited

U.S. PATENT DOCUMENTS

| 7,154,145 | B2 | 12/2006 | Takahashi |
| 8,928,030 | B2 | 1/2015 | Lu |
| 9,620,631 | B2 | 4/2017 | Matsudai et al. |
| 2020/0091323 | A1 | 3/2020 | Iwakaji et al. |

(Continued)

FOREIGN PATENT DOCUMENTS

| JP | S64-057674 A | 3/1989 |
| JP | 2005-101514 A | 4/2005 |
| JP | 2014-056942 A | 3/2014 |

(Continued)

*Primary Examiner* — Igwe U Anya
(74) *Attorney, Agent, or Firm* — Allen & Overy LLP

(57) ABSTRACT

A semiconductor element includes a semiconductor part, first to third electrodes and a control electrode. The first electrode is provided at a front side of the semiconductor part. The second and third electrodes are provided at a back side of the semiconductor part. The control electrode is provided between the semiconductor part and the first electrode. The semiconductor part includes first and third layers of a first conductivity type and second and fourth layers of a second conductivity type. The first layer is provided between the first and second electrodes and between the first and third electrodes. The first layer is connected to the third electrode at the back side. The second layer is provided between the first layer and the first electrode. The third layer is provided between the second layer and the first electrode. The fourth layer is provided between the second electrode and the first layer.

11 Claims, 6 Drawing Sheets

(56) References Cited

U.S. PATENT DOCUMENTS

| 2020/0303524 | A1* | 9/2020 | Matsu | ................. H01L 29/7397 |
| 2020/0303526 | A1* | 9/2020 | Iwakaji | ................... H01L 29/36 |

FOREIGN PATENT DOCUMENTS

| JP | 2014-086600 A | 5/2014 |
| JP | 2020-047789 A | 3/2020 |
| JP | 2020-155581 A | 9/2020 |

* cited by examiner

SEMICONDUCTOR ELEMENT AND SEMICONDUCTOR DEVICE

CROSS-REFERENCE TO RELATED APPLICATIONS

This application is based upon and claims the benefit of priority from Japanese Patent Application No. 2020-152286, filed on Sep. 10, 2020; the entire contents of which are incorporated herein by reference.

FIELD

Embodiments relate to a semiconductor element and a semiconductor device.

BACKGROUND

In recent years, IGBTs (Insulated Gate Bipolar Transistors) are being widely used as semiconductor elements having breakdown voltages not less than 600 V. For example, an IGBT is used as a switch in a power converter. Hence, it is desirable for the IGBT to have a low on-resistance and a fast switching speed. The power loss of the power converter can be reduced thereby.

DETAILED DESCRIPTION

Figure 1:
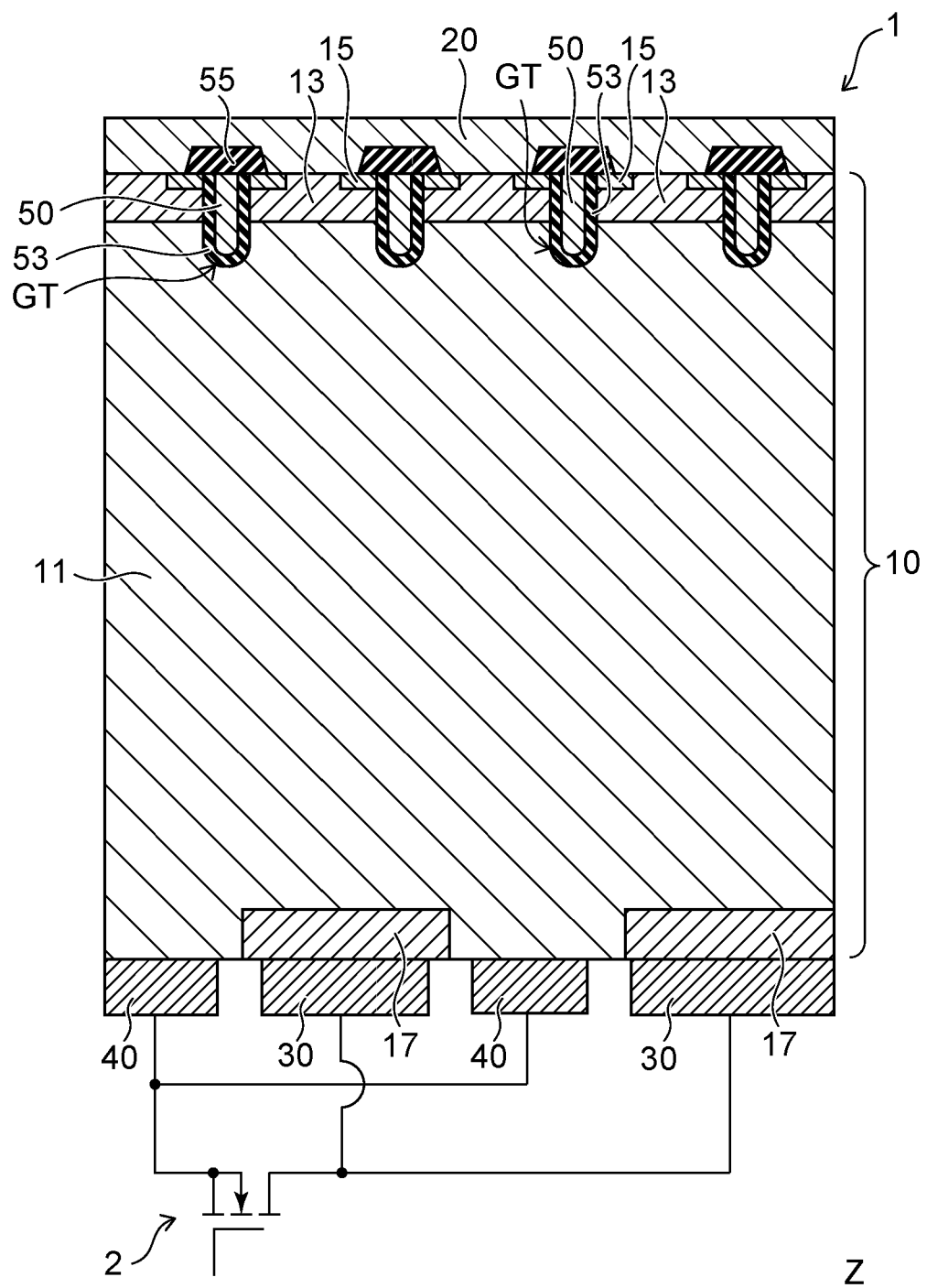
FIG. 1 is a schematic cross-sectional view showing a first semiconductor element according to an embodiment.

According to one embodiment, a semiconductor element includes a semiconductor part, first to third electrodes and a control electrode. The first electrode is provided on a front surface of the semiconductor part. The second electrode is provided on a back surface of the semiconductor part. The third electrode is provided on the back surface of the semiconductor part. The third electrode is apart from the second electrode. The control electrode is provided between the semiconductor part and the first electrode. The control electrode is electrically insulated from the semiconductor part by a first insulating film and electrically insulated from the first electrode by a second insulating film. The semiconductor part includes a first semiconductor layer of a first conductivity type, a second semiconductor layer of a second conductivity type, a third semiconductor layer of the first conductivity type, and a fourth semiconductor layer of the second conductivity type. The first semiconductor layer is provided between the first electrode and the second electrode. The first semiconductor layer extends between the first electrode and the third electrode. The first semiconductor layer is connected to the third electrode at the back surface of the semiconductor part. The second semiconductor layer is provided between the first semiconductor layer and the first electrode. The second semiconductor layer faces the control electrode via the first insulating film. The third semiconductor layer is provided between the second semiconductor layer and the first electrode. The third semiconductor layer contacts the first insulating film and is electrically connected to the first electrode. The fourth semiconductor layer is provided between the second electrode and the first semiconductor layer. The fourth semiconductor layer is electrically connected to the second electrode.

Embodiments will now be described with reference to the drawings. The same portions inside the drawings are marked with the same numerals; a detailed description is omitted as appropriate; and the different portions are described. The drawings are schematic and conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a first semiconductor element 1 according to an embodiment. The first semiconductor element 1 is, for example, an IGBT (Insulated Gate Bipolar Transistor).

As shown in FIG. 1, the first semiconductor element 1 includes a semiconductor part 10, a first electrode 20, a second electrode 30, a third electrode 40, and a control electrode 50. The semiconductor part 10 is, for example, silicon.

The first electrode 20 is provided on the front surface of the semiconductor part 10. The first electrode 20 is, for example, an emitter electrode. The second electrode 30 and the third electrode 40 are provided on the back surface of the semiconductor part 10. The second electrode 30 is, for example, a collector electrode. The second electrode 30 and the third electrode 40 are apart from each other on the back surface of the semiconductor part 10. The first electrode 20, the second electrode 30, and the third electrode 40 are, for example, metal layers including gold (Au) or aluminum (Al).

The control electrode 50 is provided between the semiconductor part 10 and the first electrode 20. The control electrode 50 is, for example, a gate electrode. The semiconductor part 10 has a trench GT provided at the front side thereof. The control electrode 50 is provided in the trench GT. The control electrode 50 is electrically insulated from the semiconductor part 10 by a first insulating film 53, and is electrically insulated from the first electrode 20 by a second insulating film 55. The control electrode 50 is, for example, conductive polysilicon. The first insulating film 53 is, for example, a gate insulating film. The second insulating film 55 is, for example, an inter-layer insulating film. The first insulating film 53 and the second insulating film 55 are, for example, silicon oxide films.

The semiconductor part 10 includes, for example, a first semiconductor layer 11 of a first conductivity type, a second semiconductor layer 13 of a second conductivity type, a third semiconductor layer 15 of the first conductivity type, and a fourth semiconductor layer 17 of the second conductivity type. In the description hereinbelow, the first conductivity type is referred to as the n-type, and the second conductivity type is referred to as the p-type.

The first semiconductor layer 11 is, for example, an n-type base layer. The first semiconductor layer 11 extends between the first electrode 20 and the second electrode 30 and between the first electrode 20 and the third electrode 40. The trench GT extends inside the first semiconductor layer 11 from the front surface of the semiconductor part 10.

The second semiconductor layer 13 is, for example, a p-type base layer. The second semiconductor layer 13 is provided between the first semiconductor layer 11 and the first electrode 20. The second semiconductor layer 13 faces the control electrode 50 via the first insulating film 53. The second semiconductor layer 13 is electrically connected to the first electrode 20.

The third semiconductor layer 15 is, for example, an n-type emitter layer. The third semiconductor layer 15 is selectively provided between the second semiconductor layer 13 and the first electrode 20. The third semiconductor layer 15 contacts the first insulating film 53 and is electrically connected to the first electrode 20.

The fourth semiconductor layer 17 is, for example, a p-type collector layer. The fourth semiconductor layer 17 is provided between the first semiconductor layer 11 and the second electrode 30. The fourth semiconductor layer 17 is electrically connected to the second electrode 30.

For example, the first semiconductor layer 11 and the fourth semiconductor layer 17 are exposed at the back surface of the semiconductor part 10. The third electrode 40 is electrically connected to the first semiconductor layer 11 exposed at the backside of the semiconductor part 10.

A first-conductivity-type region, i.e., a so-called n-type buffer region (not illustrated), may be provided between the first semiconductor layer 11 and the fourth semiconductor layer 17. The first-conductivity-type region includes a first-conductivity-type impurity with a higher concentration than the first-conductivity-type impurity in the first semiconductor layer 11. Also, a first-conductivity-type contact region (not illustrated) may be provided between the first semiconductor layer 11 and the third electrode 40. The first-conductivity-type contact region includes a first-conductivity-type impurity with a higher concentration than the first-conductivity-type impurity in the first semiconductor layer 11.

When a power conversion device is configured using the first semiconductor element 1 according to the embodiment, for example, it is preferable to connect a second semiconductor element 2 to the second and third electrodes 30 and 40. The second semiconductor element 2 is, for example, a MOS transistor. The second semiconductor element 2 is not limited to the following example and may be, for example, a bipolar transistor.

Figure 2:
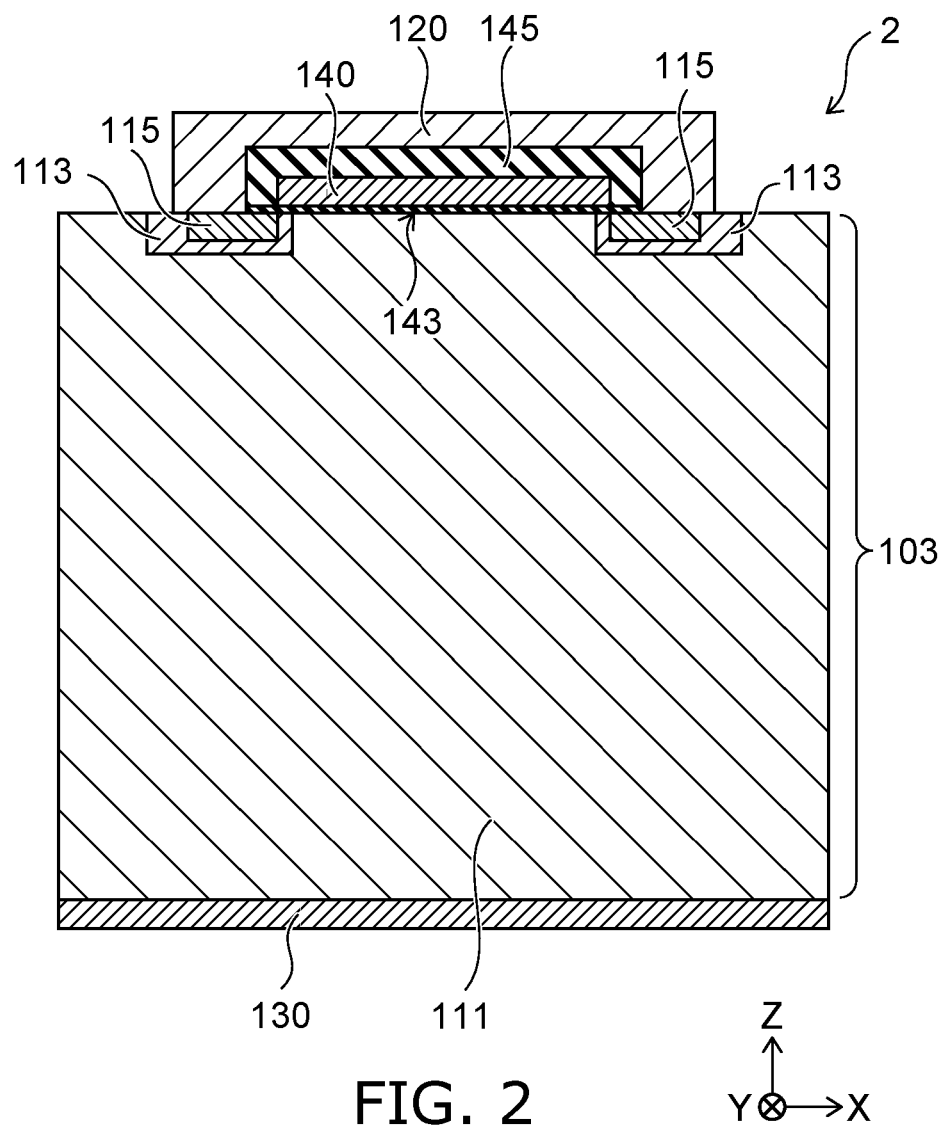
FIG. 2 is a schematic cross-sectional view showing a second semiconductor element according to the embodiment.

FIG. 2 is a schematic cross-sectional view showing the second semiconductor element 2 according to the embodiment. The second semiconductor element 2 includes a semiconductor part 103, a fourth electrode 120, a fifth electrode 130, and a control electrode 140. The semiconductor part 103 is, for example, silicon.

The fourth electrode 120 is, for example, a source electrode. The fourth electrode 120 is provided at the front side of the semiconductor part 103. The fifth electrode 130 is, for example, a drain electrode. The fifth electrode 130 is provided on the back surface of the semiconductor part 103. The fourth electrode 120 and the fifth electrode 130 are, for example, metal layers including gold (Au) or aluminum (Al).

The control electrode 140 is, for example, a gate electrode. The control electrode 140 has, for example, a planar structure and is provided on the front surface of the semiconductor part 103. The control electrode 140 is, for example, conductive polysilicon. The control electrode 140 is electrically insulated from the semiconductor part 103 by a third insulating film 143. The third insulating film 143 is, for example, a gate insulating film. The third insulating film 143 is, for example, a silicon oxide film.

The fourth electrode 120 covers the control electrode 140. The control electrode 140 is electrically insulated from the fourth electrode 120 by a fourth insulating film 145. The fourth insulating film 145 is, for example, an inter-layer insulating film. The fourth insulating film 145 is, for example, a silicon oxide film.

The semiconductor part 103 includes a fifth semiconductor layer 111 of the first conductivity type, a sixth semiconductor layer 113 of the second conductivity type, and a seventh semiconductor layer 115 of the first conductivity type.

The fifth semiconductor layer 111 is, for example, an n-type drift layer. The fifth semiconductor layer 111 extends between the fourth electrode 120 and the fifth electrode 130. The fifth semiconductor layer 111 is electrically connected to the fifth electrode 130.

The sixth semiconductor layer 113 is, for example, a p-type diffusion layer. The sixth semiconductor layer 113 is selectively provided between the fifth semiconductor layer 111 and the fourth electrode 120. The sixth semiconductor layer 113 includes portions that are apart from each other at the front surface of the semiconductor part 103 in a direction along the front surface of the semiconductor part 103, e.g., the X-direction. The fifth semiconductor layer 111 extends between the portions of the sixth semiconductor layer 113 apart from each other. The fifth semiconductor layer 111 faces the control electrode 140 via the third insulating film 143. The sixth semiconductor layer 113 is electrically connected to the fourth electrode 120.

The seventh semiconductor layer 115 is selectively provided between the sixth semiconductor layer 113 and the fourth electrode 120. The seventh semiconductor layer 115 contacts the third insulating film 143 and is electrically connected to the fourth electrode 120. The sixth semiconductor layer 113 extends between the fifth semiconductor layer 111 and the seventh semiconductor layer 115 and faces the control electrode 140 via the third insulating film 143.

A first-conductivity-type region, i.e., a so-called n-type drain layer (not-illustrated), may be provided between the fifth semiconductor layer 111 and the fifth electrode 130. The first-conductivity-type region includes a first-conductivity-type impurity with a higher concentration than the first-conductivity-type impurity in the fifth semiconductor layer 111.

Figure 3:
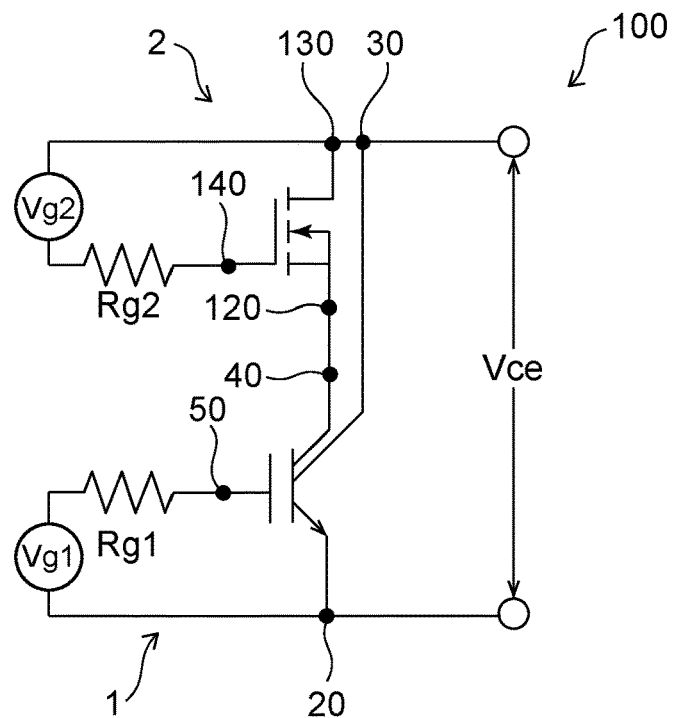
FIG. 3 is a circuit diagram showing the semiconductor device according to the embodiment.

FIG. 3 is a circuit diagram showing a semiconductor device 100 according to the embodiment. The semiconductor device 100 includes the first semiconductor element 1 and the second semiconductor element 2. In FIG. 3, Vg1 and Vg2 represent the gate drivers. As described below, the semiconductor device 100 may include the gate drivers controlling a first gate voltage Vg1 and a second gate voltage Vg2.

As shown in FIG. 3, a collector voltage Vce is applied between the first electrode 20 and the second electrode 30 of the first semiconductor element 1. The third electrode 40 of the first semiconductor element 1 is electrically connected to the fourth electrode 120 of the second semiconductor element 2. The fifth electrode 130 of the second semiconductor element 2 is electrically connected to the second electrode 30 of the first semiconductor element 1.

The first gate voltage Vg1 is applied via a first gate resistance Rg1 between the first electrode 20 and the control electrode 50 of the first semiconductor element 1. The second gate voltage Vg2 is applied via a second gate resistance Rg2 between the fifth electrode 130 and the control electrode 140 of the second semiconductor element 2. A method for controlling the semiconductor device 100 will now be described with reference to FIGS. 1, 2, and 3.

For example, while the collector voltage Vce is applied between the first electrode 20 and the second electrode 30 of the first semiconductor element 1, the first gate voltage Vg1 that is applied between the first electrode 20 and the control electrode 50 is increased from a voltage less than the threshold voltage of the control electrode 50 to a voltage greater than the threshold voltage, for example, from −15 V to +15 V. Thereby, the first semiconductor element 1 is turned to the on-state, and an on-current flows between the second electrode 30 and the first electrode 20. The collector voltage Vce decreases to a voltage that is the product of the on-resistance and the on-current of the first semiconductor element 1. Meanwhile, the potential of the control electrode 140 is maintained to be not more than the threshold of the control electrode 140 by the second gate voltage Vg2; and the second semiconductor element 2 is in the off-state.

In the on-state of the first semiconductor element 1, electrons are injected from the first electrode 20 into the first semiconductor layer 11 via an n-type inversion layer induced at the interface between the second semiconductor layer 13 and the first insulating film 53 by the first gate voltage Vg1. Accordingly, holes are injected from the fourth semiconductor layer 17 into the first semiconductor layer 11. The carrier concentration in the first semiconductor layer 11 can be increased thereby, and the on-resistance is reduced.

Then, the first gate voltage Vg1 is reduced from the voltage greater than the threshold voltage of the control electrode 50 to a voltage less than the threshold voltage, for example, from +15 V to −15 V. Thereby, the n-type inversion layer that is induced at the interface between the second semiconductor layer 13 and the first insulating film 53 disappears, and the electron injection from the first electrode 20 into the first semiconductor layer 11 is stopped. Therefore, the collector voltage Vce increases; the holes that are in the first semiconductor layer 11 are ejected into the first electrode 20 via the second semiconductor layer 13; and the electrons are ejected into the second electrode 30 via the fourth semiconductor layer 17. The first semiconductor element 1 is turned to the off-state when the holes and electrons in the first semiconductor layer 11 are ejected and the first semiconductor layer 11 is depleted.

The switching loss of the semiconductor device 100 is dependent on the turn-off time that is the period from when the first gate voltage Vg1 is reduced to the voltage less than the threshold voltage of the control electrode 50 until the first semiconductor layer 11 is depleted. For example, the switching loss of the semiconductor device 100 increases as the turn-off time increases.

In the method for controlling the semiconductor device 100 according to the embodiment, for example, the second semiconductor element 2 is turned to the on-state while the second gate voltage Vg2 increases the potential of the control electrode 140 to be not less than the threshold voltage thereof. Simultaneously, the first gate voltage Vg1 is reduced to be not more than the threshold voltage of the control electrode 50, and the first semiconductor element 1 is turned off. Thereby, the electrons are ejected from the first semiconductor layer 11 via the third electrode 40 and the second semiconductor element 2, and the depletion of the first semiconductor layer 11 is promoted. Further, the hole injection from the fourth semiconductor layer 17 into the first semiconductor layer 11 is suppressed because the electron ejection via the fourth semiconductor layer 17 is reduced; and thus, it is possible to promote the reduction of the accumulated carriers. Therefore, the turn-off time of the first semiconductor element 1 can be reduced, and the switching loss can be reduced.

Figure 4:
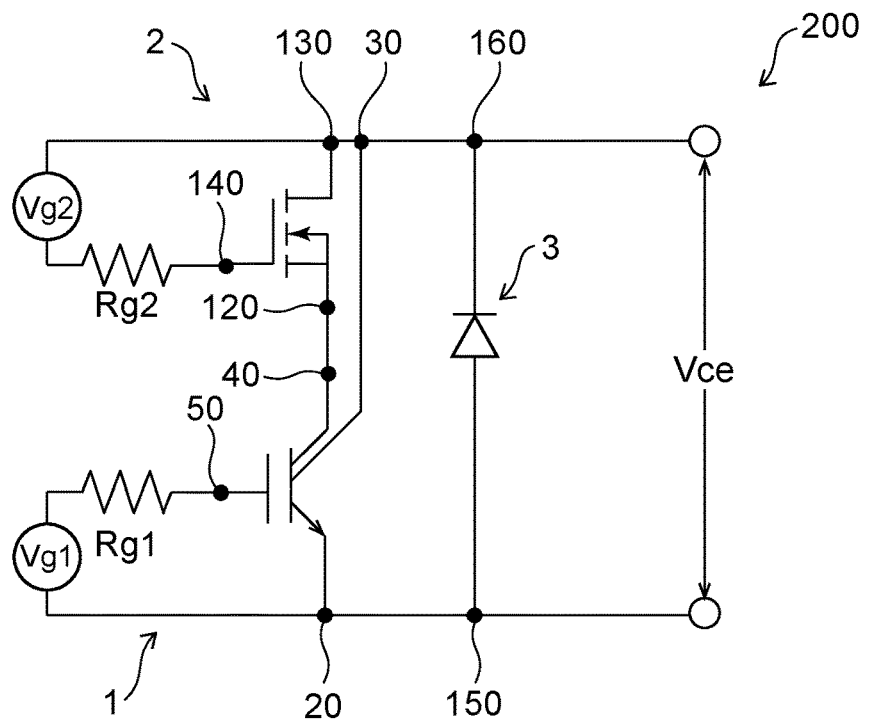
FIG. 4 is a circuit diagram showing a semiconductor device according to a modification of the embodiment.

FIG. 4 is a circuit diagram showing a semiconductor device 200 according to a modification of the embodiment. As shown in FIG. 4, the semiconductor device 200 includes the first semiconductor element 1, the second semiconductor element 2, and a third semiconductor element 3. The third semiconductor element 3 is, for example, a diode.

As shown in FIG. 4, the third electrode 40 of the first semiconductor element 1 is electrically connected to the fourth electrode 120 of the second semiconductor element 2. The fifth electrode 130 of the second semiconductor element 2 is electrically connected to the second electrode 30 of the first semiconductor element 1. The switching loss of the semiconductor device 200 can be reduced thereby.

The third semiconductor element 3 includes a sixth electrode 150 and a seventh electrode 160. The sixth electrode 150 is, for example, an anode electrode. The seventh electrode 160 is, for example, a cathode electrode. As shown in FIG. 4, the sixth electrode 150 is electrically connected to the first electrode 20 of the first semiconductor element 1. The seventh electrode 160 is electrically connected to the second electrode 30 of the first semiconductor element 1. For example, the third semiconductor element 3 serves as a freewheeling diode.

Figure 5:
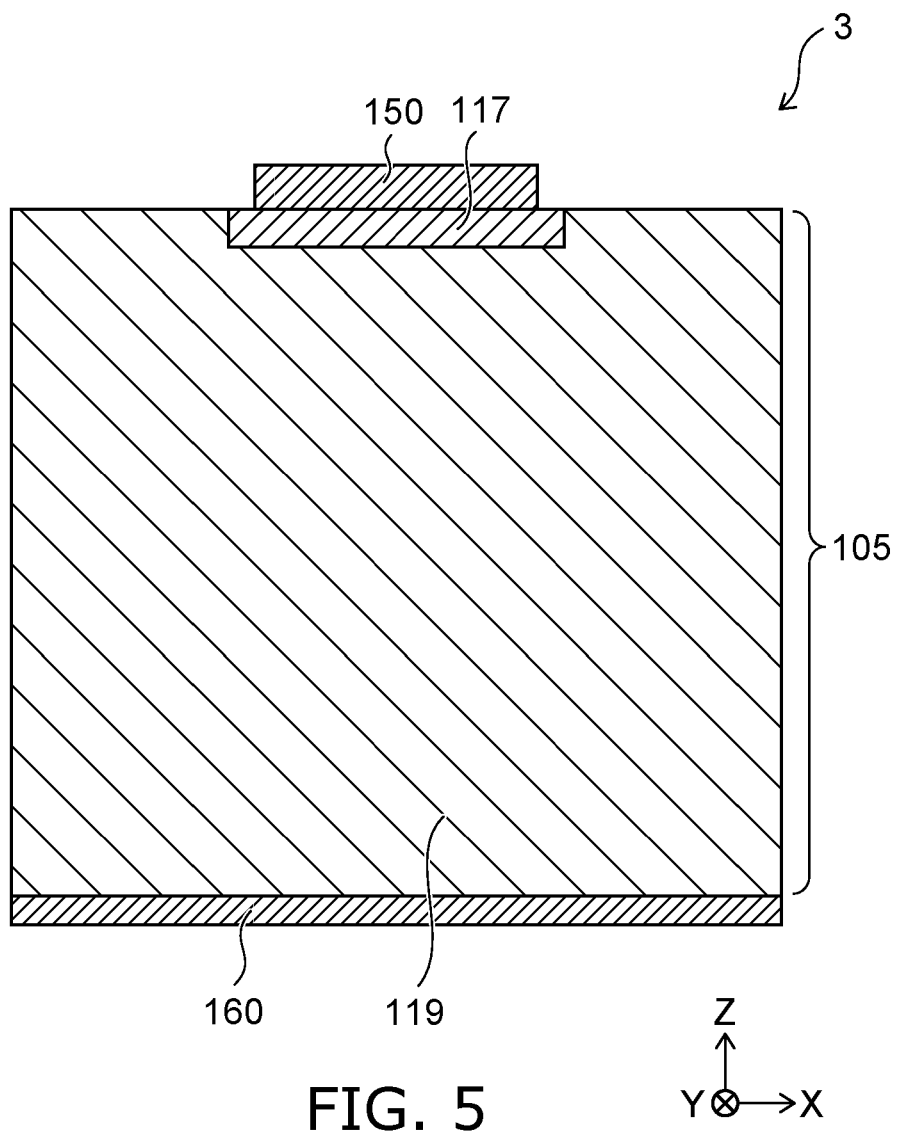
FIG. 5 is a schematic cross-sectional view showing a third semiconductor element according to a modification of the embodiment.

FIG. 5 is a schematic cross-sectional view showing the third semiconductor element 3. The third semiconductor element 3 includes, for example, a semiconductor part 105, the sixth electrode 150, and the seventh electrode 160. The sixth electrode 150 is provided on the front surface of the semiconductor part 105. The seventh electrode 160 is provided on the back surface of the semiconductor part 105. The semiconductor part 105 is, for example, silicon. The sixth electrode 150 and the seventh electrode 160 are, for example, metal layers including gold (Au) or aluminum (Al).

The semiconductor part 105 includes an eighth semiconductor layer 117 of the second conductivity type and a ninth semiconductor layer 119 of the first conductivity type. The eighth semiconductor layer 117 is, for example, a p-type anode layer. The eighth semiconductor layer 117 is provided between the ninth semiconductor layer 119 and the sixth electrode 150 and electrically connected to the sixth electrode 150.

The ninth semiconductor layer 119 is, for example, an n-type intrinsic layer. The ninth semiconductor layer 119 is electrically connected to the seventh electrode 160. A so-called n-type cathode layer (not illustrated) may be provided between the ninth semiconductor layer 119 and the seventh electrode 160. The n-type cathode layer includes an n-type impurity with a higher concentration than the n-type impurity in the ninth semiconductor layer 119.

Figure 6:
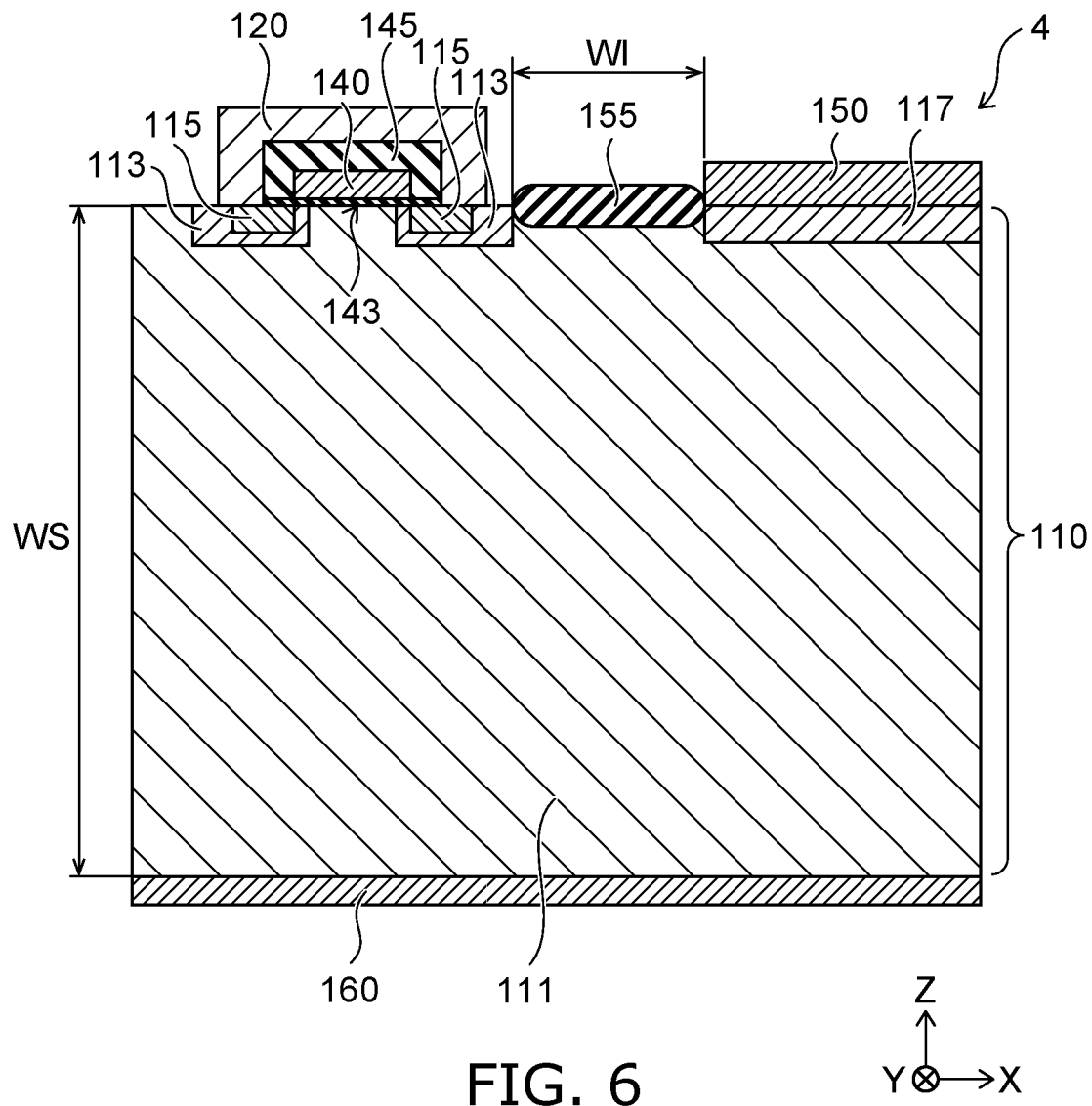
FIG. 6 is a schematic cross-sectional view showing a fourth semiconductor element according to a modification of the embodiment.

FIG. 6 is a schematic cross-sectional view showing a fourth semiconductor element 4 according to a modification of the embodiment. For example, the fourth semiconductor element 4 has a structure in which the second semiconductor element 2 and the third semiconductor element 3 are integrated.

As shown in FIG. 6, the fourth semiconductor element 4 includes a semiconductor part 110, the fourth electrode 120, the control electrode 140, the sixth electrode 150, and the seventh electrode 160. The semiconductor part 110 is, for example, silicon. The control electrode 140 is, for example, a gate electrode that has a planar structure.

The control electrode 140 is provided between the semiconductor part 110 and the fourth electrode 120. The control electrode 140 is electrically insulated from the semiconductor part 110 by the third insulating film 143. Also, the control electrode 140 is electrically insulated from the fourth electrode 120 by the fourth insulating film 145.

The semiconductor part 110 is provided between the fourth electrode 120 and the seventh electrode 160 and between the sixth electrode 150 and the seventh electrode 160. The sixth electrode 150 is provided at the front side of the semiconductor part 110 and is apart from the fourth electrode 120. The seventh electrode 160 is provided on the back surface of the semiconductor part 110. The seventh electrode 160 also is used as the fifth electrode 130 of the second semiconductor element 2.

The semiconductor part 110 includes the fifth semiconductor layer 111 of the first conductivity type, the sixth semiconductor layer 113 of the second conductivity type, the seventh semiconductor layer 115 of the first conductivity type, and the eighth semiconductor layer 117 of the second conductivity type.

The fifth semiconductor layer 111 extends between the fourth electrode 120 and the seventh electrode 160 and between the sixth electrode 150 and the seventh electrode 160. The fifth semiconductor layer 111 also is used as the ninth semiconductor layer 119.

The sixth semiconductor layer 113 is selectively provided between the fifth semiconductor layer 111 and the fourth electrode 120. The sixth semiconductor layer 113 includes portions that are apart from each other in a direction along the front surface of the semiconductor part 110, e.g., the X-direction. The fifth semiconductor layer 111 extends between the portions of the sixth semiconductor layer 113 apart from each other. The fifth semiconductor layer faces the control electrode 140 via the third insulating film 143.

The seventh semiconductor layer 115 is selectively provided between the sixth semiconductor layer 113 and the fourth electrode 120. The seventh semiconductor layer 115 contacts the third insulating film 143. Also, the sixth semiconductor layer 113 extends between the fifth semiconductor layer 111 and the seventh semiconductor layer 115, and faces the control electrode 140 via the third insulating film 143.

The eighth semiconductor layer 117 is provided between the fifth semiconductor layer 111 and the sixth electrode 150. The eighth semiconductor layer 117 is apart from the sixth semiconductor layer 113. An insulating region 155 is provided between the sixth semiconductor layer 113 and the eighth semiconductor layer 117. The insulating region 155 is, for example, LOCOS (Local Oxidation of Silicon) or STI (Shallow Trench Isolation) and electrically insulates the eighth semiconductor layer 117 from the sixth semiconductor layer 113. The insulating region 155 is, for example, a silicon oxide film.

The insulating region 155 has a width WI in the direction from the fourth electrode 120 toward the sixth electrode 150 along the front surface of the semiconductor part 110, e.g., the X-direction. The width WI of the insulating region 155 is, for example, greater than a thickness WS in the Z-direction of the semiconductor part 110. Thereby, the desired breakdown voltage can be obtained between the sixth semiconductor layer 113 and the eighth semiconductor layer 117.

Figure 7:
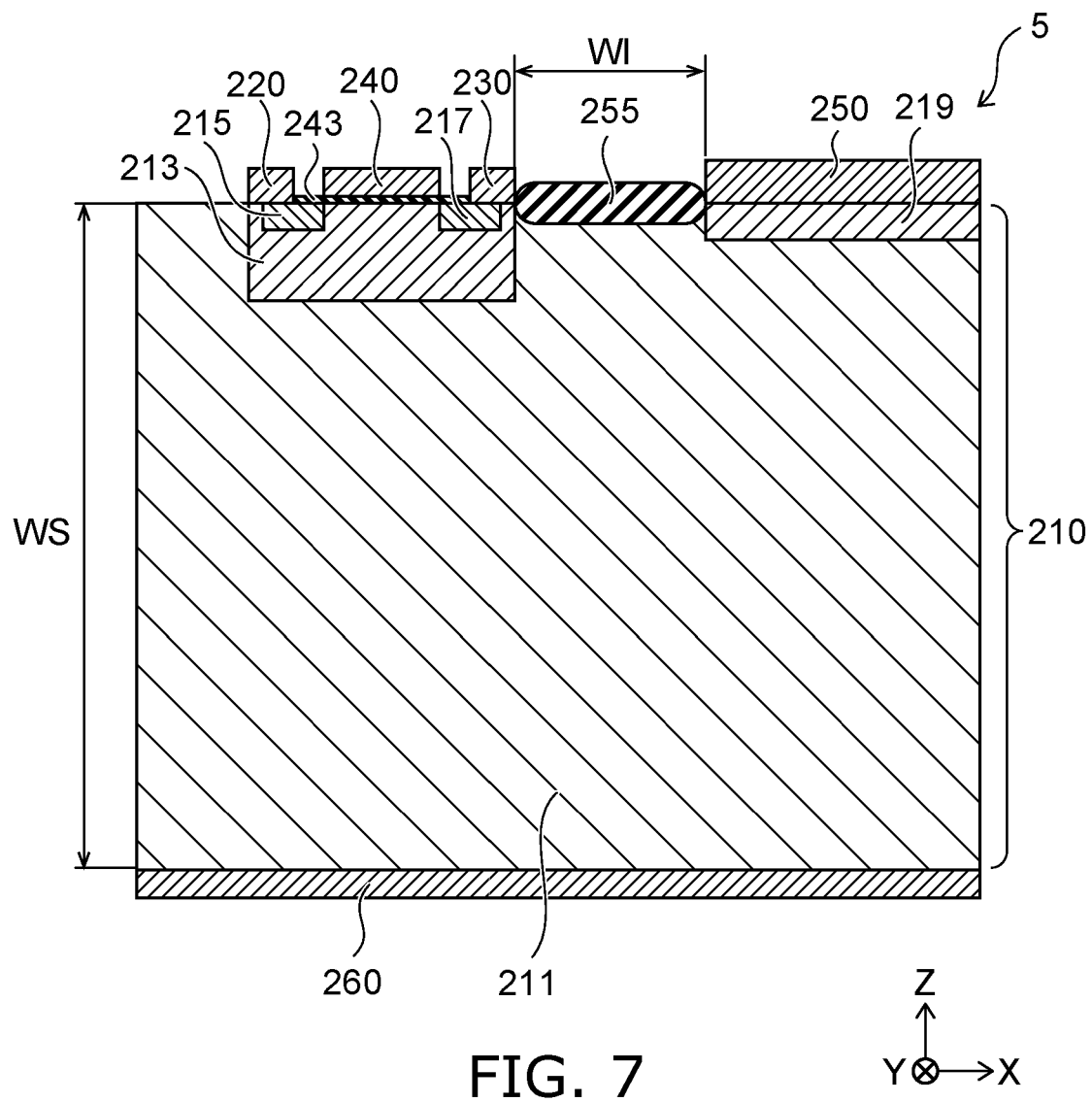
FIG. 7 is a schematic cross-sectional view showing a fifth semiconductor element according to a modification of the embodiment.

FIG. 7 is a schematic cross-sectional view showing a fifth semiconductor element 5 according to a modification of the embodiment. The fifth semiconductor element 5 has a structure in which a MOS transistor and a diode are integrated.

As shown in FIG. 7, the fifth semiconductor element 5 includes a semiconductor part 210, a fourth electrode 220, a fifth electrode 230, a control electrode 240, a sixth electrode 250, and a seventh electrode 260. The semiconductor part 210 is, for example, silicon.

The fourth electrode 220, the fifth electrode 230, the control electrode 240, and the sixth electrode 250 are provided at the front side of the semiconductor part 210. The seventh electrode 260 is provided on the back surface of the semiconductor part 210.

The fourth electrode 220, the fifth electrode 230, the control electrode 240, and the sixth electrode 250 are apart from each other. The control electrode 240 is provided between the fourth electrode 220 and the fifth electrode 230.

The control electrode 240 is, for example, a planar gate electrode and is provided on the front surface of the semiconductor part 210. The control electrode 240 is electrically insulated from the semiconductor part 210 by a third insulating film 243.

The semiconductor part 210 is provided between the fourth electrode 220 and the seventh electrode 260, between the fifth electrode 230 and the seventh electrode 260, between the control electrode 240 and the seventh electrode 260, and between the sixth electrode 250 and the seventh electrode 260.

The semiconductor part 210 includes a fifth semiconductor layer 211 of the first conductivity type, a sixth semiconductor layer 213 of the second conductivity type, a seventh semiconductor layer 215 of the first conductivity type, a second seventh-semiconductor layer 217 of the first conductivity type, and an eighth semiconductor layer 219 of the second conductivity type.

The fifth semiconductor layer 211 extends between the fourth electrode 220 and the seventh electrode 260, between the fifth electrode 230 and the seventh electrode 260, between the control electrode 240 and the seventh electrode 260, and between the sixth electrode 250 and the seventh electrode 260.

The sixth semiconductor layer 213 is provided between the fifth semiconductor layer 211 and the fourth electrode 220, between the fifth semiconductor layer 211 and the fifth electrode 230, and between the fifth semiconductor layer 211 and the control electrode 240. The sixth semiconductor layer 213 is, for example, a p-type well.

The seventh semiconductor layer 215 is selectively provided between the sixth semiconductor layer 213 and the fourth electrode 220. The seventh semiconductor layer 215 is, for example, an n-type source layer. The seventh semiconductor layer 215 contacts the third insulating film 243.

The second seventh-semiconductor layer 217 is selectively provided between the sixth semiconductor layer 213 and the fifth electrode 230. The second seventh-semiconductor layer 217 is, for example, an n-type drain layer. The second seventh-semiconductor layer 217 contacts the third insulating film 243. The sixth semiconductor layer 213 extends between the seventh semiconductor layer 215 and the second seventh-semiconductor layer 217. The sixth semiconductor layer 213 faces the control electrode 240 via the third insulating film 243.

The eighth semiconductor layer 219 is provided between the fifth semiconductor layer 211 and the sixth electrode 150. The eighth semiconductor layer 219 is apart from the sixth semiconductor layer 213. An insulating region 255 is provided between the sixth semiconductor layer 213 and the eighth semiconductor layer 219. The insulating region 255 is, for example, LOCOS (Local Oxidation of Silicon) or STI (Shallow Trench Isolation) and electrically insulates the eighth semiconductor layer 219 from the sixth semiconductor layer 213. The insulating region 255 is, for example, a silicon oxide film.

The insulating region 255 has the width WI in the direction from the fifth electrode 230 toward the sixth electrode 250 along the front surface of the semiconductor part 210, e.g., the X-direction. The width WI of the insulating region 255 is, for example, greater than the thickness WS in the Z-direction of the semiconductor part 210. Thereby, the desired breakdown voltage can be obtained between the sixth semiconductor layer 213 and the eighth semiconductor layer 219.

As described above, for example, the number of semiconductor elements included in the semiconductor device 200 can be reduced by using the semiconductor element 4 or 5 in which the MOS transistor and the diode are integrated. The semiconductor device 200 can be downsized thereby.

For example, it may be possible to integrate the first semiconductor element 1 and the second semiconductor element 2 by forming a MOS gate structure at the backside of the first semiconductor element 1. However, when forming a MOS gate structure at the backside of the first semiconductor element 1, the manufacturing processes of the first semiconductor element 1 is difficulty. In the embodiment, the manufacturing process load can be reduced because it is unnecessary to form a MOS gate at the backside of the first semiconductor element 1. Also, the reliability of the first semiconductor element 1 is not reduced because the MOS gate structure is not formed at the back surface of the first semiconductor element 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor element, comprising:
a semiconductor part including a first semiconductor layer of a first conductivity type, a second semiconductor layer of a second conductivity type, a third semiconductor layer of the first conductivity type, and a fourth semiconductor layer of the second conductivity type;
a first electrode provided on a front surface of the semiconductor part;
a second electrode provided on a back surface of the semiconductor part,
the first semiconductor layer being provided between the first electrode and the second electrode, the second semiconductor layer being provided between the first semiconductor layer and the first electrode, the third semiconductor layer being provided between the second semiconductor layer and the first electrode, the fourth semiconductor layer being provided between the second electrode and the first semiconductor layer, the fourth semiconductor layer contacting the second electrode and being electrically connected to the second electrode;
a third electrode provided on the back surface of the semiconductor part, the third electrode being apart from the second electrode,
the first semiconductor layer extending between the first electrode and the third electrode, the first semiconductor layer contacting the third electrode at the back surface of the semiconductor part and being electrically connected to the third electrode; and
a control electrode provided between the semiconductor part and the first electrode, the control electrode being electrically insulated from the semiconductor part by a first insulating film and electrically insulated from the first electrode by a second insulating film, the second semiconductor layer facing the control electrode via the first insulating film, the third semiconductor layer contacting the first insulating film and being electrically connected to the first electrode.

2. The semiconductor element according to claim 1, wherein
the semiconductor part having a trench at the front surface side,
the control electrode is provided in the trench of the semiconductor part,
the first insulating film covers an inner surface of the trench and is provided between the semiconductor part and the control electrode, and
the second insulating film is provided between the first electrode and the control electrode and covers an opening of the trench.

3. A device, comprising:
a first semiconductor element including
a first semiconductor part including a first semiconductor layer of a first conductivity type, a second semiconductor layer of a second conductivity type, a third semiconductor layer of the first conductivity type, and a fourth semiconductor layer of the second conductivity type,
a first electrode provided on a front surface of the first semiconductor part,
a second electrode provided on a back surface of the first semiconductor part,
the first semiconductor layer being provided between the first electrode and the second electrode, the second semiconductor layer being provided between the first semiconductor layer and the first electrode, the third semiconductor layer being provided between the second semiconductor layer and the first electrode, the fourth semiconductor layer being provided between the second electrode and the first semiconductor layer and electrically connected to the second electrode,
a third electrode provided on the back surface of the first semiconductor part, the third electrode being apart from the second electrode,
the first semiconductor layer extending between the first electrode and the third electrode, the first semiconductor layer being connected to the third electrode at the back surface of the semiconductor part, and a first control electrode provided between the first semiconductor part and the first electrode, the first control electrode being electrically insulated from the first semiconductor part by a first insulating film and electrically insulated from the first electrode by a second insulating film, the second semiconductor layer facing the first control electrode via the first insulating film, the third semiconductor layer contacting the first insulating film and being electrically connected to the first electrode; and a second semiconductor element including a second semiconductor part, a fourth electrode, a fifth electrode, and a second control electrode, the second semiconductor element being electrically connected to the first semiconductor element, the fourth electrode being electrically connected to the second semiconductor part and the third electrode of the first semiconductor element, the fifth electrode being electrically connected to the second semiconductor part and the second electrode of the first semiconductor element, the second control electrode being configured to control an electrical conduction between the fourth electrode and the fifth electrode.

4. The device according to claim 3, wherein the second semiconductor part is provided between the fourth electrode and the fifth electrode, the second semiconductor part including a fifth semiconductor layer of the first conductivity type, a sixth semiconductor layer of the second conductivity type, and a seventh semiconductor layer of the first conductivity type, the fifth semiconductor layer being provided between the fourth electrode and the fifth electrode and electrically connected to the fifth electrode, the sixth semiconductor layer being provided between the fifth semiconductor layer and the fourth electrode, the sixth semiconductor layer facing the second control electrode via a third insulating film, the sixth semiconductor being electrically connected to the fourth electrode, the seventh semiconductor layer being provided between the sixth semiconductor layer and the fourth electrode, the seventh semiconductor layer contacting the third insulating film, and being electrically connected to the fourth electrode.

5. The device according to claim 4, wherein the second control electrode is provided on a front surface of the second semiconductor part, the third insulating film being provided between the second semiconductor part and the second control electrode, the second control electrode being electrically insulated from the second semiconductor part by the third insulating film, the fourth electrode covers the second control electrode at the front side of the second semiconductor part, the fourth insulating film being provided between the fourth electrode and the second control electrode, the second control electrode being electrically insulated from the fourth electrode by a fourth insulating film, and the fifth electrode is provided on a back surface of the second semiconductor part.

6. The device according to claim 4, wherein the second semiconductor element further includes a sixth electrode provided on a front surface of the second semiconductor part, the sixth electrode being apart from the fourth electrode, the second semiconductor part further includes an eighth semiconductor layer of the second conductivity type provided between the fifth semiconductor layer and the sixth electrode, the eighth semiconductor layer being electrically connected to the sixth electrode, and the fifth semiconductor layer is provided between the fourth electrode and the fifth electrode and between the sixth electrode and the fifth electrode.

7. The device according to claim 6, wherein the second semiconductor element includes an insulating region provided between the fourth electrode and the sixth electrode at the front surface side of the second semiconductor part.

8. The device according to claim 7, wherein the insulating region has a width in a direction from the fourth electrode toward the sixth electrode along the front surface of the second semiconductor part, the width of the insulating region being greater than a thickness of the second semiconductor part in a direction from the fifth electrode toward the fourth electrode.

9. The device according to claim 3, further comprising:

a third semiconductor element including a sixth electrode, a seventh electrode and a third semiconductor part, the sixth electrode being electrically connected to the first electrode of the first semiconductor element, the seventh electrode being electrically connected to the second electrode of the first semiconductor element, the third semiconductor part being provided between the sixth electrode and the seventh electrode, the third semiconductor part including an eighth semiconductor layer of the second conductivity type, and a ninth semiconductor layer of the first conductivity type, the eighth semiconductor layer being electrically connected to the sixth electrode, the ninth semiconductor layer being provided between the eighth semiconductor layer and the seventh electrode, the ninth semiconductor layer being electrically connected to the seventh electrode.

10. The device according to claim 3, wherein the second semiconductor element further includes a sixth electrode and a seventh electrode, the fourth to sixth electrodes are provided on a front surface of the second semiconductor part, the fifth electrode being apart from the fourth electrode, the sixth electrode being apart from the fourth and fifth electrodes, the seventh electrode is provided on a back surface of the second semiconductor part, the second control electrode is provided on the front surface of the second semiconductor part between the fourth electrode and the fifth electrode, and the second semiconductor part includes a fifth semiconductor layer of the first conductivity type, a sixth semiconductor layer of the second conductivity type, a seventh semiconductor layer of the first conductivity type, a second seventh-semiconductor layer of the first conductivity type, and an eighth semiconductor layer of the second conductivity type, the fifth semiconductor layer being provided between the fourth electrode and the seventh electrode, between the fifth electrode and the seventh electrode, between the second control electrode and the seventh electrode, and between the sixth electrode and the seventh electrode, the fifth semiconductor layer being electrically connected to the seventh electrode, the sixth semiconductor layer being provided between the fifth semiconductor layer and the fourth electrode, between the fifth semiconductor layer and the fifth electrode, and between the fifth semiconductor layer and the second control electrode, the sixth semiconductor layer facing the second control electrode via a third insulating film, the seventh semiconductor layer being provided between the sixth semiconductor layer and the fourth electrode, the seventh semiconductor layer contacting the third insulating film and being electrically connected to the fourth electrode, the second seventh-semiconductor layer being provided between the sixth semiconductor layer and the fifth electrode, the second seventh-semiconductor layer contacting the third insulating film, and being electrically connected to the fifth electrode, and the eighth semiconductor layer being provided between the fifth semiconductor layer and the sixth electrode, the eighth semiconductor layer being electrically connected to the sixth electrode.

11. The device according to claim 3, further comprising:

a driver applying a first control voltage between the first control electrode and the first electrode and applying a second control voltage between the second control electrode and the fifth electrode, the first control electrode inducing an inverted channel in the second semiconductor layer, when the first control voltage being greater than a first threshold voltage, the driver applying the second control voltage causing electrical conduction between the fourth electrode and the fifth electrode, when switching the first control voltage to be less than the first threshold voltage from being greater than the first threshold voltage.

* * * * *